United States Patent
Kim et al.

(10) Patent No.: US 10,121,954 B2
(45) Date of Patent: Nov. 6, 2018

(54) THERMOELEMENT AND A WEARABLE DEVICE COMPRISING THE SAME

(71) Applicant: INDUSTRY-ACADEMIC COOPERATION FOUNDATION, YONSEI UNIVERSITY, Seoul (KR)

(72) Inventors: Woochul Kim, Seoul (KR); Yoo Min Eom, Seoul (KR); Jun Phil Hwang, Seoul (KR); Dimuthu prasad Herath Mudiyanselage, Seoul (KR); Hoon Kim, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/204,166

(22) Filed: Jul. 7, 2016

(65) Prior Publication Data
US 2017/0170380 A1  Jun. 15, 2017

(30) Foreign Application Priority Data
Dec. 14, 2015  (KR) .................. 10-2015-0178640

(51) Int. Cl.
*H01L 35/30* (2006.01)
*H01L 35/10* (2006.01)
*H01L 35/26* (2006.01)

(52) U.S. Cl.
CPC .............. *H01L 35/30* (2013.01); *H01L 35/10* (2013.01); *H01L 35/26* (2013.01)

(58) Field of Classification Search
CPC .......... H01L 35/30; H01L 35/10; H01L 35/26
See application file for complete search history.

(56) References Cited

U.S. PATENT DOCUMENTS

| | | | | |
|---|---|---|---|---|
| 3,282,267 A | * | 11/1966 | Eidus | A61F 7/00 248/586 |
| 5,332,084 A | * | 7/1994 | Greve | B65G 17/08 198/851 |
| 6,314,741 B1 | * | 11/2001 | Hiraishi | H01L 35/30 136/203 |
| 2010/0006132 A1 | * | 1/2010 | Hodes | H01L 35/30 136/224 |
| 2011/0297203 A1 | * | 12/2011 | Salvador | H01L 35/32 136/239 |

FOREIGN PATENT DOCUMENTS

JP  11-206032 A  7/1999

OTHER PUBLICATIONS

Communication dated Apr. 14, 2017 from the Korean Intellectual Property Office in corresponding Korean Patent Application No. 10-2015-0178640.

* cited by examiner

*Primary Examiner* — Tae-Sik Kang
(74) *Attorney, Agent, or Firm* — Sughrue Mion, PLLC

(57) ABSTRACT

Disclosed is a thermoelement including a body including a plurality of joint portions, at least two of the plurality of joint portions being rotatably connected to each other, a shaft provided to the body and configured to provide a center of rotation of the plurality of joint portions, and a thermoelectric material provided between the plurality of joint portions.

6 Claims, 12 Drawing Sheets

THERMOELEMENT AND A WEARABLE DEVICE COMPRISING THE SAME

CROSS-REFERENCE TO RELATED APPLICATION

This application claims the priority benefit of Korean Patent Application No. 10-2015-0178640, filed on Dec. 14, 2015, in the Korean Intellectual Property Office, the disclosure of which is incorporated herein by reference.

BACKGROUND

1. Technical Field

Exemplary embodiments relate to a thermoelement and a wearable device including the thermoelement, and more particularly, to a thermoelement in which a plurality of thermoelectric materials are connected in a structure similar to a watch chain, thereby flexibly correspond to a variety of shapes, and a wearable device including the thermoelement.

2. Related Art

A thermoelement refers to an element using the effect that comes from interaction between heat and electricity. In general, the thermoelement includes a heat source, a heat sink and a thermopile. The thermopile includes a plurality of thermocouples (thermoelectric elements) connected in series, and is used to convert a portion of thermal energy to electrical energy.

In terms of a type, the thermoelement may be a thermistor, an element using the Seebeck effect, a Peltier element, and the like. Here, the thermistor refers to an element using a change in temperature of electrical resistance and the element using the Seebeck effect refers to an element using the Seebeck effect that is a phenomenon in which a current is produced due to a temperature difference. The Peltier element refers to an element using the Peltier effect that is a phenomenon in which the absorption or the production of heat occurs due to a current.

In general, the thermoelement is formed using a semiconductor material. To form thermocouples, semiconductor materials are electrically connected in series and thermally connected in parallel and form two junctions. Typically, semiconductor materials include an N-type semiconductor material and a P-type semiconductor material. In a typical thermoelement, electrically conductive connection is formed between a P-type semiconductor material and an N-type semiconductor material. Further, carriers migrate from a hot junction to a cold junction as a result of thermal diffusion and induce a current.

A relatively high Seebeck constant and a sufficient temperature difference are required to produce electricity from thermal energy using the thermoelement. In the thermoelement according to the related art, for example, Korean Patent Registration No. 10-1384981, registered on Apr. 8, 2014, a method of increasing a thickness of a thermoelectric material is employed to realize a sufficient temperature difference. However, in the method of increasing the thickness of the thermoelectric material, it is difficult to realize a desired temperature or more due to electrical resistance and heat of the thermoelectric material. Further, a large amount of materials may be used.

In this regard, the thermoelement may be flexibly configured. In this case, the thermoelement may be significantly thin in a thickness direction compared to a lengthwise direction and thus, a sufficient temperature difference between a heat sink and a heat source may not be maintained and the thermoelement may not efficiently function.

SUMMARY

Exemplary embodiments provide a thermoelement in which a plurality of thermoelectric materials in a structure for maintaining a sufficient temperature difference between a heat sink and a heat source is electrically connected by providing a support body between the plurality of thermoelectric materials and electrical energy may be obtained from thermal energy, and a wearable device including the thermoelement.

Exemplary embodiments also provide a thermoelement in which a plurality of thermoelectric materials is connected in a structure similar to a watch chain, thereby flexibly corresponding to a variety of shapes, and a wearable device including the thermoelement.

According to an aspect of exemplary embodiments, there is provided a thermoelement including a body including a plurality of joint portions, at least one of the plurality of joint portions being rotatably connected to each other, a shaft provided to the body and configured to provide a center of rotation of the plurality of joint portions, and a thermoelectric material provided between the plurality of joint portions.

Also, each of the plurality of joint portions may be formed of a nonconductive material.

Also, the plurality of joint portions may includes a plurality of horizontal joint portions and a vertical joint portion that extends in a direction in which the vertical joint portion intersects the horizontal joint portions, and the thermoelectric material may be provided between the plurality of horizontal joint portions.

Also, a support body of a nonconductive material may be provided between the plurality of joint portions, and the thermoelectric material may encompass at least a portion of the support body.

Also, the body may include a first rotation connector configured to protrude from one side of a first horizontal joint portion of the horizontal portions and a second rotation connector configured to protrude from one side of a horizontal joint portion of the horizontal portions that is adjacent to the first joint portion. A first rotation connector may be configured to rotatably couple with the second rotation connector. The shaft may be provided between the first rotation connector and the second rotation connector. The first rotation connector may include shaft supports configured to support both ends of the shaft, respectively, and the second rotation connector may include a shaft penetrator provided between the shaft supports and configured to be penetrated by the shaft.

Also, a saw-toothed shape may be formed on at least a portion of an outer circumferential surface of each of the shaft supports, and the second rotation connector may include an angle controller configured to adjust a rotation angle of the first rotation connector and the second rotation connector through interference with the saw-toothed shape of the shaft supports.

Also, the shaft may be configured to penetrate the support body.

Also, the shaft may be formed of a flexible material.

Also, the thermoelectric material may include a P-type thermoelectric material and an N-type thermoelectric material. The P-type thermoelectric material and the N-type thermoelectric material may be alternately disposed in a horizontal direction and a vertical direction, and neighboring thermoelectric materials may be connected by way of an electrode of a metal material. A plurality of first electrodes may be disposed side by side in the horizontal direction on one side of the body and a plurality of second electrodes may be disposed side by side in the vertical direction on the other side of the body.

Also, each of the first and second electrodes may be configured to further laterally protrude compared to each joint portion of the plurality of joint portions.

Also, the thermoelectric material and each of the first and second electrodes may be configured to couple with each other through a surface contact.

Also, the thermoelectric material may be attached to the joint portion by adhesives.

According to another aspect of example embodiments, there is provided a wearable device including an information provider configured to transfer information to an outside, and an energy generator configured to produce electrical energy to be supplied to the information provider. In the energy generator, a plurality of joint portions may be consecutively connected to be rotatable by way of a shaft and a thermoelectric material may be provided between the plurality of joint portions.

Also, one end of the thermoelectric material may be in contact with a human body and another end of the thermoelectric material may be exposed in the air or is contacted to heat sink.

Also, at least a portion of the plurality of joint portions may be separate from each other at predetermined distances, and at least one of a thermoelectric material, a battery, an electrical circuit may be provided between the plurality of joint portions.

Also, a support body of a nonconductive material may be provided between the plurality of joint portions, the thermoelectric material may encompass at least a portion of the support body, and the shaft may be configured to penetrate the support body.

Also, the thermoelectric material may include a P-type thermoelectric material and an N-type thermoelectric material. The P-type thermoelectric material and the N-type thermoelectric material may be alternately disposed in a horizontal direction and a vertical direction, and neighboring thermoelectric materials may be connected by way of an electrode of a metal material.

Also, a plurality of electrodes may be disposed side by side in the horizontal direction on one side of the body, with connecting the horizontally neighboring thermoelectric materials, and another plurality of electrodes may be disposed side by side in the vertical direction on the other side of the body, with connecting the vertically neighboring thermoelectric materials.

The thermoelectric material may be attached to the joint portion.

According to still another aspect of example embodiments, there is provided a wearable device including a refrigeration part in which a plurality of joint portions is consecutively connected to be rotatable by way of a shaft and a thermoelectric material is provided to the plurality of joint portions, a battery configured to store electricity to be supplied to the refrigeration part, and a switch configured to selectively supply the electricity of the battery to the refrigeration part.

According to example embodiments, since a plurality of thermoelectric materials is connected to each other by way of a rotatably connected joint portion, it is possible to correspond to a flexible shape, such as an overall curved shape.

Also, according to example embodiments, it is possible to maintain a sufficient temperature difference based on a support body of a nonconductive material by applying a thermoelement to a wearable device such as a smart watch and the like and by using a body temperature of a person as a heat source. Thus, it is possible to produce electricity by using a function of the thermoelement.

Also, according to example embodiments, by applying electricity to a wearable device in a state in which a thermoelement is applied to the wearable device, the thermoelement of the wearable device may produce heat to an outside or absorb the heat from the outside to warm up or cool down a human body.

BRIEF DESCRIPTION OF THE DRAWINGS

These and/or other aspects, features, and advantages of the invention will become apparent and more readily appreciated from the following description of embodiments, taken in conjunction with the accompanying drawings of which:

FIG. 7b is a perspective view of a thermoelement according to the other exemplary embodiment which takes an angle controller from the exemplary embodiment of the FIG. 7a;

FIG. 8a is a cross-sectional vies of the thermoelement cut along line Z-Z' of FIG. 7a;

DETAILED DESCRIPTION OF THE INVENTION

Figure 1:
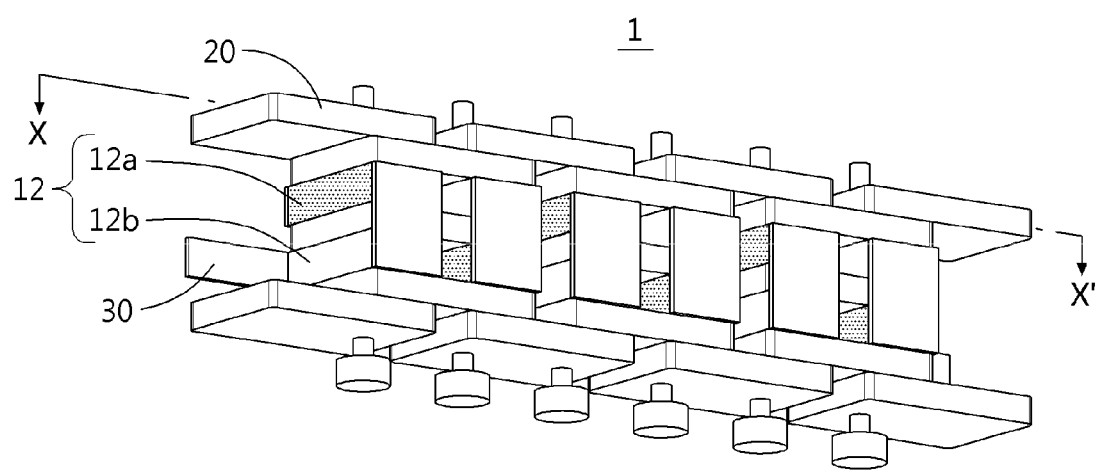
FIG. 1 is a perspective view of a thermoelement according to an exemplary embodiment.

Hereinafter, exemplary embodiments will be described with reference to the accompanying drawings. Herein, thicknesses of lines, sizes of constituent elements, etc., illustrated in the drawings, may be exaggerated for clarity and convenience of description. Further, terms described in the following are ones defined based on functions in the present disclosure and thus, may vary based on the intent of a user or an operator, or custom. Accordingly, the definition of such terms should be made based on the overall description disclosed in the present specification.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Figure 2:
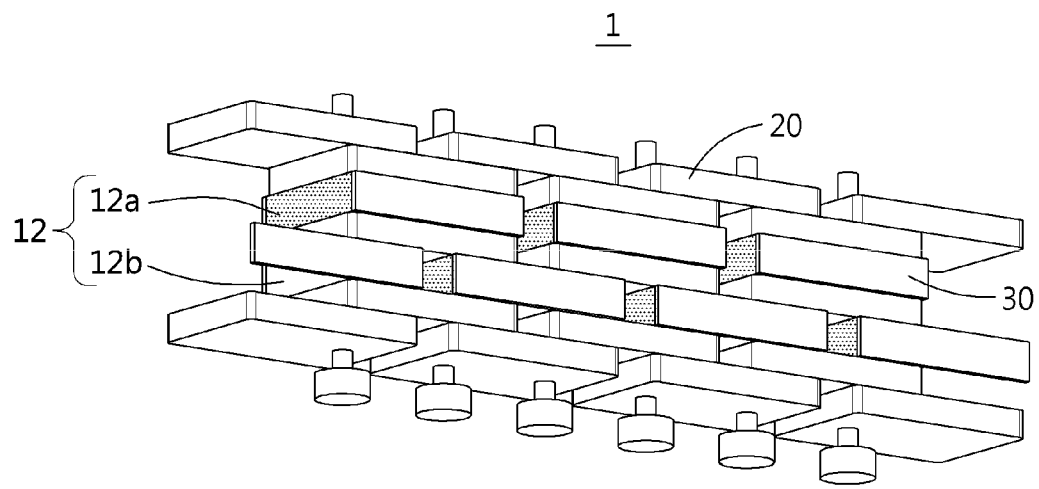
FIG. 2 is a perspective view of the thermoelement of FIG. 1 observed in a different direction according to an exemplary embodiment.
Figure 3:
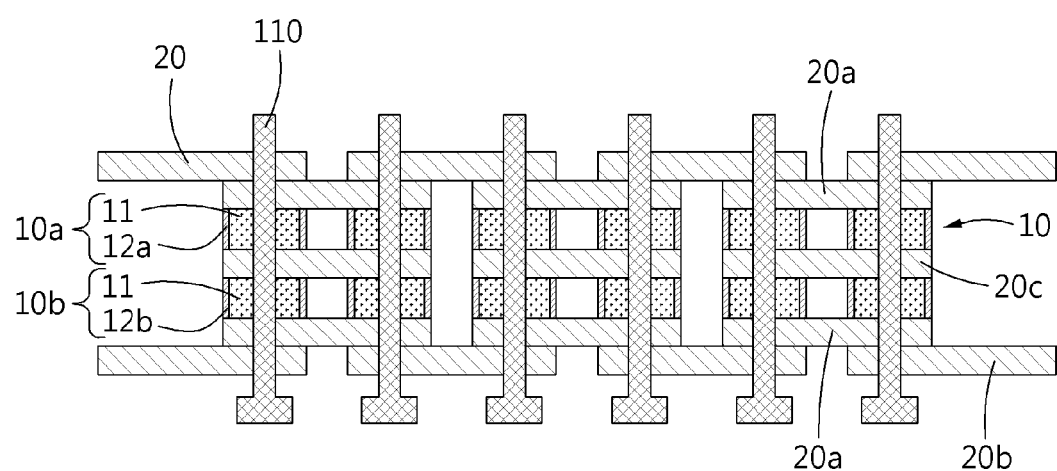
FIG. 3 is a cross-sectional view of the thermoelement cut along line X-X' of FIG. 1.
Figure 4:
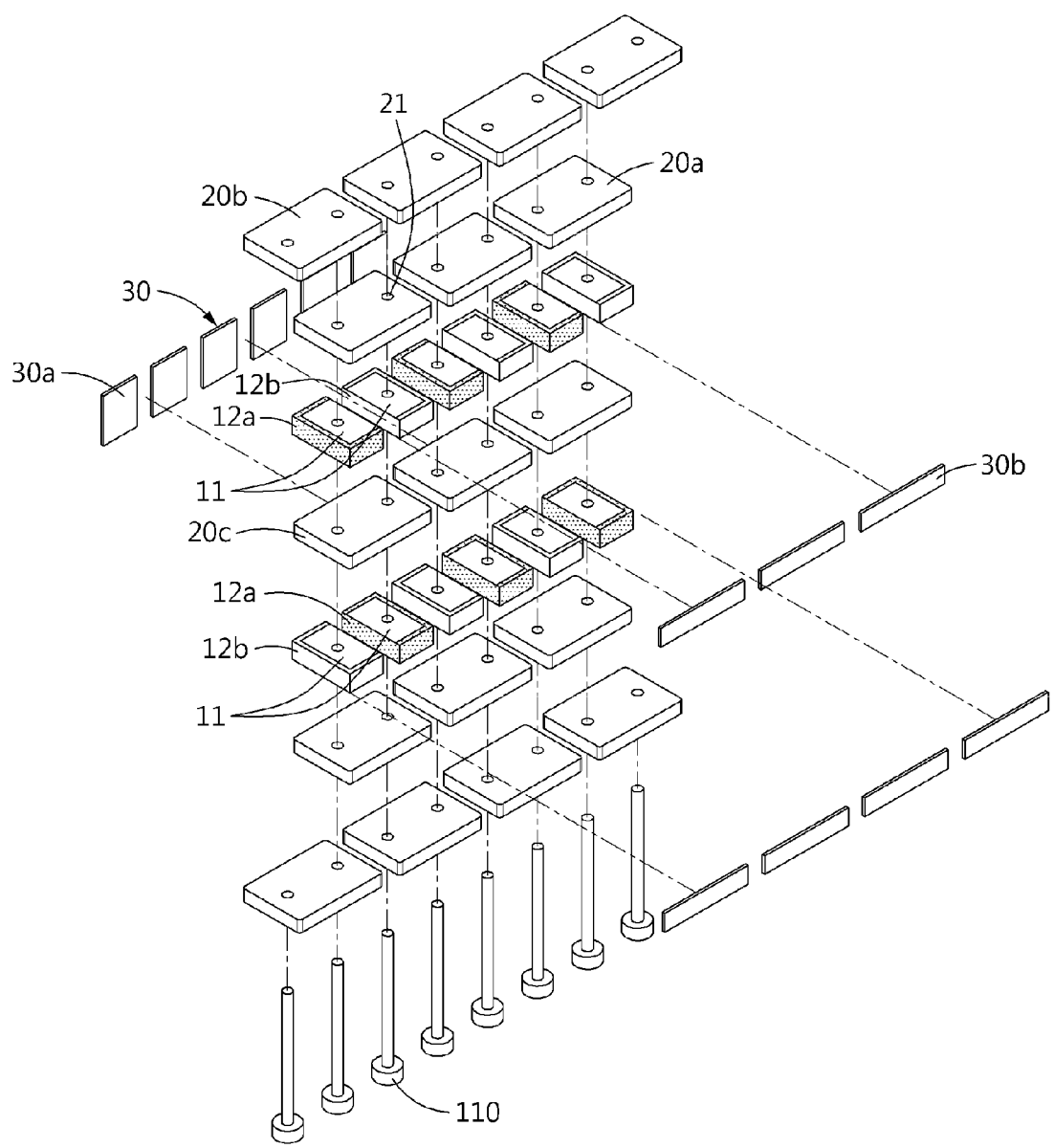
FIG. 4 is an exploded perspective view of a thermoelement according to an exemplary embodiment.
Figure 5:
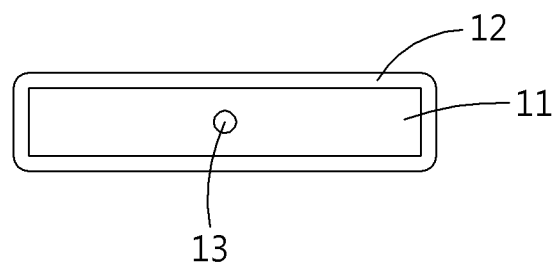
FIG. 5 is a bottom view of a thermoelectric material support module in which a support body of a thermoelement and a thermoelectric material are coupled according to an exemplary embodiment.
Figure 6:
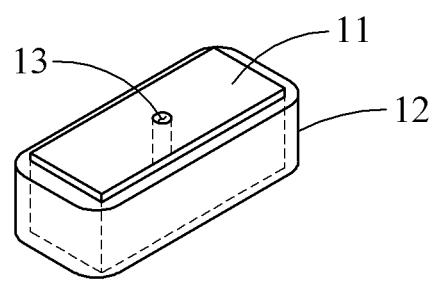
FIG. 6 is a perspective view of a body of a thermoelement according to an exemplary embodiment.

FIG. 1 is a perspective view of a thermoelement according to an exemplary embodiment, FIG. 2 is a perspective view of the thermoelement of FIG. 1 observed in a different direction according to an exemplary embodiment, FIG. 3 is a cross-sectional view of the thermoelement cut along line X-X' of FIG. 1, FIG. 4 is an exploded perspective view of a thermoelement according to an exemplary embodiment, FIG. 5 is a bottom view of a thermoelectric material support module in which a support body of a thermoelement and a thermoelectric material are coupled according to an exemplary embodiment, and FIG. 6 is a perspective view of a body of a thermoelement according to an exemplary embodiment.

Referring to FIGS. 1 through 6, a thermoelement 1 according to an exemplary embodiment may include a body 20 including a plurality of joint portions 20a, 20b, and 20c, a shaft 110 configured to provide a center of rotation of the joint portions 20a, 20b, 20c, and a thermoelectric material 12 provided between the plurality of joint portions 20a, 20b, and 20c.

The joint portions 20a, 20b, and 20c may include a first joint portion 20a, a second joint portion 20b, and a third joint portion 20c, and the terms are interchangeably used herein. At least two of the plurality of joint portions 20a, 20b, and 20c may be rotatably connected to each other.

Each of the joint portions 20a, 20b, and 20c may be formed of a nonconductive material.

Among the joint portions 20a, 20b, and 20c, the first joint portion 20a and the third joint portion 20c may be separate from each other at a desired or predetermined distance. A support body 11 of a nonconductive material and the thermoelectric material 12 configured to encompass at least a portion of the support body 11 may be provided between the first joint portion 20a and the third joint portion 20c that are separate from each other.

That is, the thermoelectric material 12 may be provided between the plurality of joint portions. A battery, and an electrical circuit as well as the thermoelectric material 12 also may be provided between the plurality of joint portions.

The support body 11 may be in a rectangular shape and may be inserted into a space formed between the curved thermoelectric materials 12. Referring to FIG. 6, at least one support body via-hole 13 may be formed on the support body 11.

The support body 11 may be configured using a nonconductive material having a relatively low thermal conductivity, such as acryl, and may maintain a sufficient temperature difference by minimizing a thermal conduction that is transferred in a thickness direction. That is, since the support body 11 is formed of the nonconductive material having the relatively low thermal conductivity, a relatively high heat resistance may occur due to the relatively low thermal conductivity of the support body 11. Due to the relatively high heat resistance, a relatively high temperature difference may be maintained between both ends of the thermoelement 1. Although a thickness of the thermoelectric material 12 is set to be sufficiently thin, a sufficient temperature difference may be maintained through the support body 11. Thus, various applications and modifications can be made.

The thermoelectric material 12 may be provided on the surface of the support body 11 to encompass at least a portion of the support body 11. The thermoelectric material 12 may include an organic material or an inorganic material. The thermoelectric material 12 may be coupled on the surface of the support body 11 using a metal-organic chemical vapor deposition (MOCVD), an electrochemical vapor deposition (ECVD), or sputtering, which is applied to manufacture a semiconductor device.

The thermoelectric material 12 may include a P-type thermoelectric material 12a and an N-type thermoelectric material 12b. The P-type thermoelectric material 12a and the N-type thermoelectric material 12b may be alternately disposed in a horizontal direction and a vertical direction. The neighboring thermoelectric materials 12 may be connected by way of an electrode 30 of a metal material.

In detail, the thermoelement 1 may be provided in a structure in which a plurality of thermoelement units 10 are rotatably connected by way of the second joint portion 20b. The thermoelement unit 10 may include a first thermoelectric material support module 10a including the support body 11 and the P-type thermoelectric material 12a configured to encompass the support body 11 and a second thermoelectric material support module 10b including the N-type thermoelectric material 12b configured to encompass another support body 11.

Here, flow of electrons with (+) charge may occur in the first thermoelectric material support module 10a including the P-type thermoelectric material 12a. Flow of electrons with (−) charge may occur in the second thermoelectric material support module 10b including the N-type thermoelectric material 12b. The first thermoelectric material support module 10a and the second thermoelectric material support module 10*b* may be connected by way of the electrode 30. The electrical flow may occur between the first thermoelectric material support module 10*a* and the second thermoelectric material support module 10*b* having different charges. As described above, in a single thermoelement unit 10, at least four thermoelectric material support modules 10*a* and 10*b* may be coupled between the first joint portion 20*a* and the third joint portion 20*c* by alternately disposing the first thermoelectric material support modules 10*a* and the second thermoelectric material support modules 10*b*. A plurality of thermoelement units 10 each including the thermoelectric material support modules 10*a* and 10*b* may be coupled by way of the second joint portion 20*b*, thereby configuring a single thermoelement 1.

Referring to FIG. 4, the electrode 30 may include a plurality of first electrodes 30*a* disposed side by side in the vertical direction on one side of the thermoelement unit 10 and a plurality of second electrodes 30*b* disposed side by side in the horizontal direction on the other side of the thermoelement unit 10. Here, the first electrode 30*a* and the second electrode 30*b* may couple with the thermoelectric material 12 through a surface contact.

The electrode 30 may further laterally protrude compared to the body 20. That is, the first electrode 30*a* may further protrude toward one side compared to one sides of the first through third joint portions 20*a*, 20*b*, and 20*c*. The second electrode 30*b* may further protrude toward the other side compared to the other sides of the first through third joint portions 20*a*, 20*b*, and 20*c*.

Figure 9A:
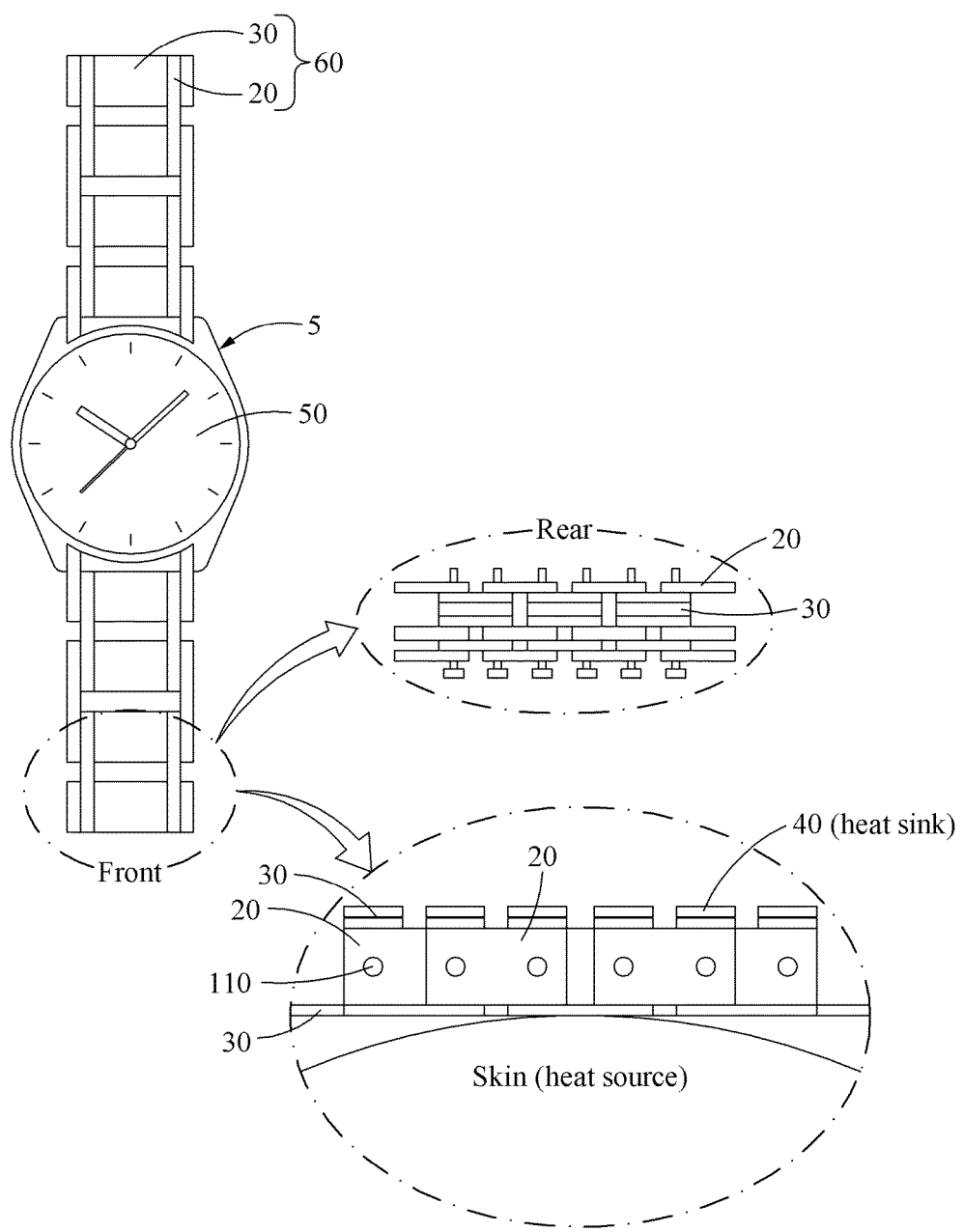
FIG. 9a illustrates an example of a wearable device according to an exemplary embodiment which comprises a heat sink.
Figure 9B:
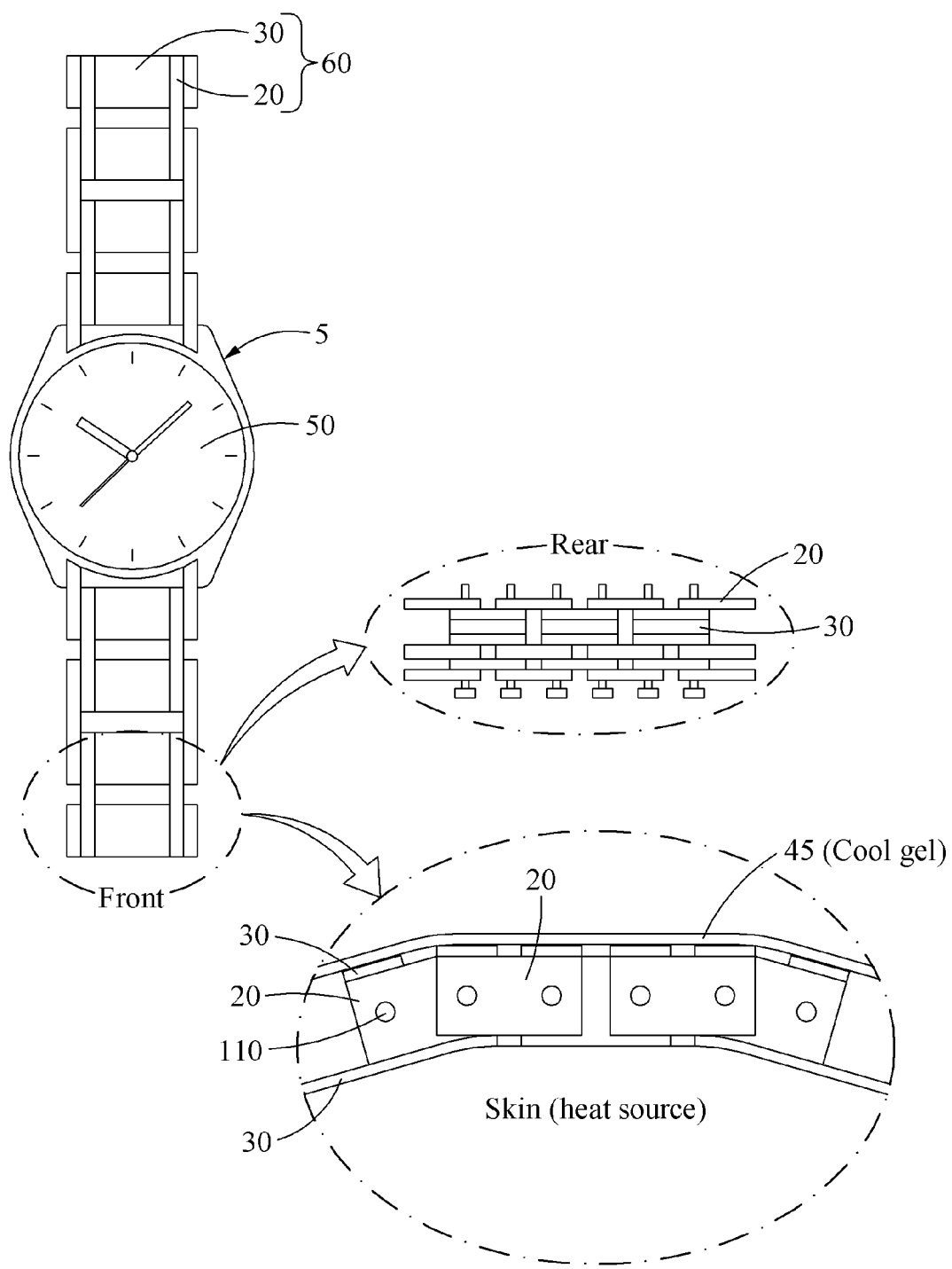
FIG. 9b illustrates an example of a wearable device according to an exemplary embodiment which comprises a cool gel as a heat sink.

Accordingly, referring to FIGS. 9*a* and 9*b*, when applying the thermoelement 1 of the exemplary embodiment to a wearable device 5, such as a smart watch, etc., the electrode 30 may make a first contact with the skin before the body 20, thereby effectively transferring heat to the thermoelectric material 12.

The second joint portion 20*b* may connect the plurality of thermoelement units 10 and may rotatably couple with the thermoelement unit 10. For example, although the joint portion 20*a*, 20*b*, 20*c* may be formed in a rectangular shape, such as a constituent piece of a metal watch, it is only an example and the exemplary embodiment is not limited thereto.

At least one joint portion via-hole 21 may be formed on the joint portions 20*a*, 20*b*, 20*c*. The joint portion via-hole 21 and the support body via-hole 13 may be disposed on the same shaft line. Alternatively, the shaft 110 configured to rotatably couple the support body 11 and the body 20 may be inserted into the joint portion via-hole 21 and the support body via-hole 13.

The shaft 110 may be formed in an extending cylindrical shape, and may penetrate the support body 11 and the body 20. Also, the shaft 110 may be coupled to be rotatable relative to the support body 11 and the body 20. The shaft 110 may be formed of a hard material and also may be formed of a flexible material.

The body 20 may be formed of a hard material. For example, the body 20 may be formed of a plastic material. Any type of material having hard and light properties may be used for the body 20.

The electrode 30 may be formed of a metal material that allows flow of electricity. For example, the electrode 30 may be provided as a thin plate of a metal material. Also, the electrode 30 may be provided as a thin film of a metal material to have a flexibly bending property.

The electrodes 30 may be electrically connected to each other. The electrodes 30 may couple with the thermoelectric material 12 to electrically connect the plurality of thermoelement units 10 to each other.

Figure 7A:
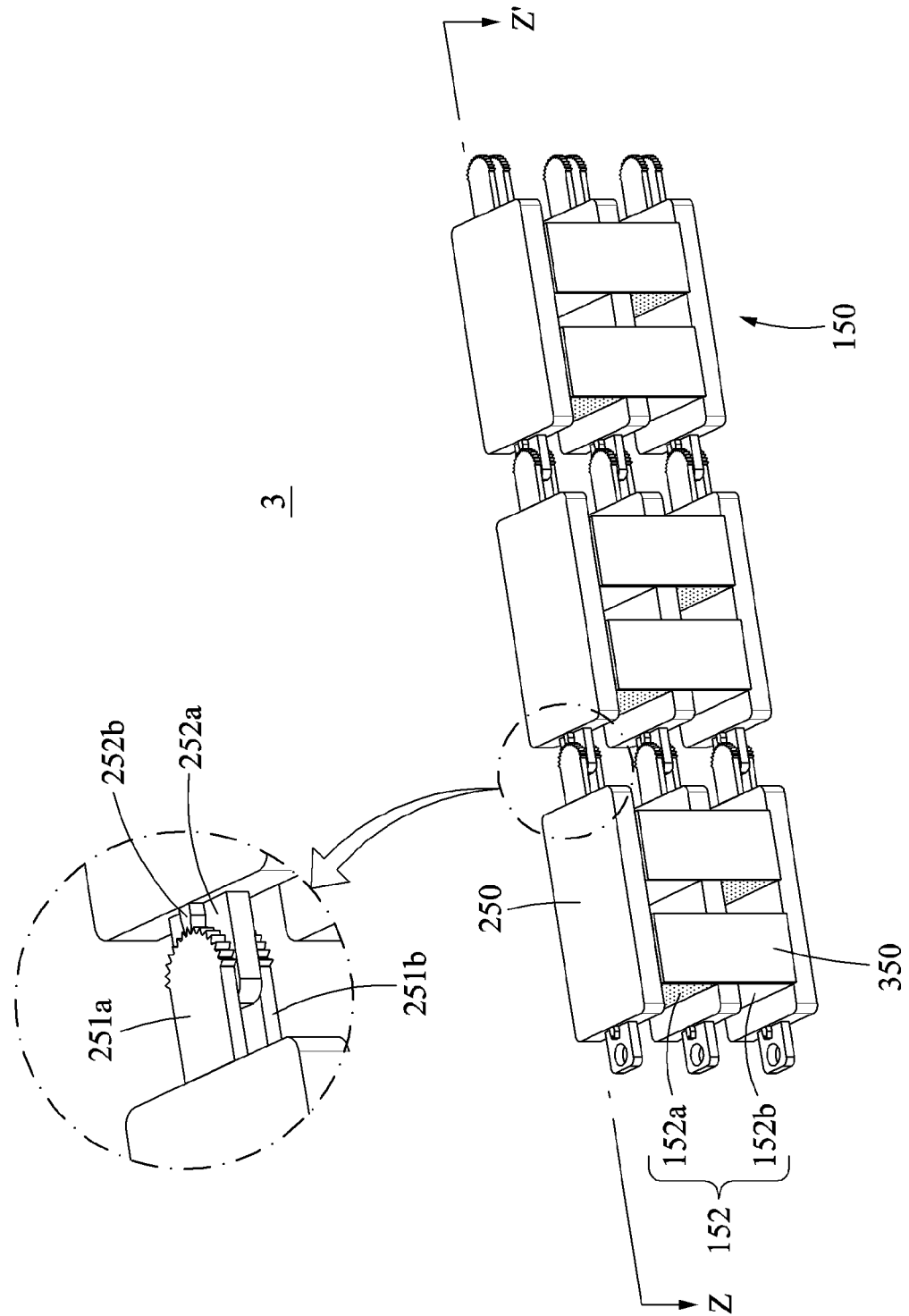
FIG. 7a is a perspective view of a thermoelement according to another exemplary embodiment.
Figure 7B:
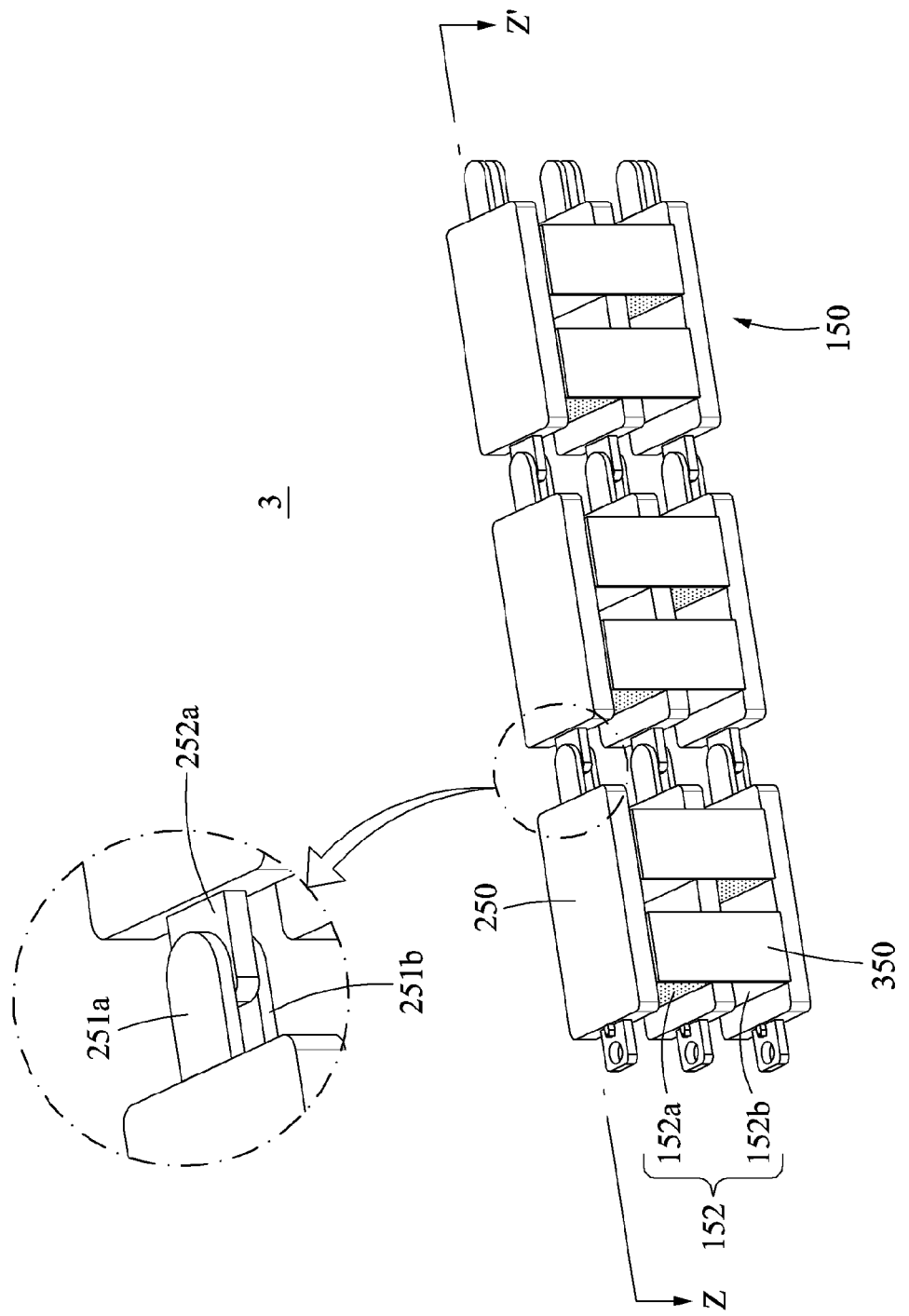
Figure 8A:
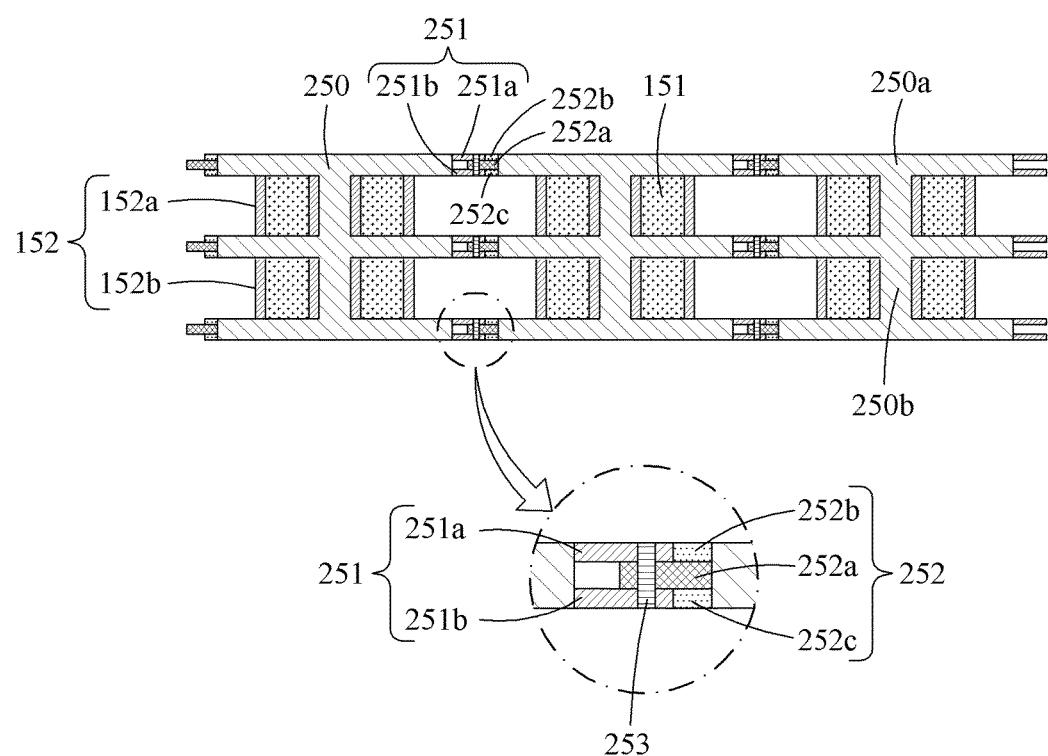
Figure 8B:
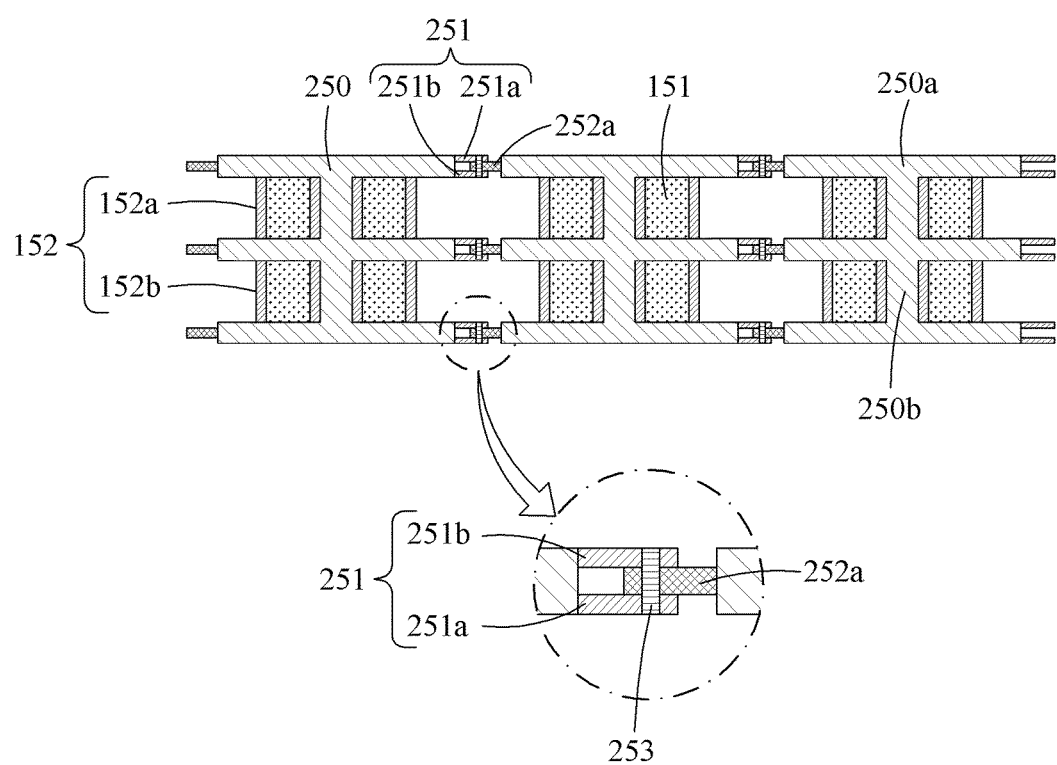
FIG. 8b is a cross-sectional view of the thermoelement cut along line Z-Z' of FIG. 7b.

FIG. 7*a* is a perspective view of a thermoelement according to another exemplary embodiment, FIG. 7*b* is a perspective view of a thermoelement according to the other exemplary embodiment which takes an angle controller from the exemplary embodiment of the FIG. 7*a*, FIG. 8*a* is a cross-sectional vies of the thermoelement cut along line Z-Z' of FIG. 7*a*, FIG. 8*b* is a cross-sectional view of the thermoelement cut along line Z-Z' of FIG. 7*b*.

Hereinafter, a description will be made based on a difference with the aforementioned thermoelement 1.

Referring to FIGS. 7*a*, 7*b* and 8*a* and 8*b*, a thermoelement 3 according to another exemplary embodiment may include a support body 151, a thermoelectric material 152, a body 250, and an electrode 350.

The body 250 that includes a plurality of horizontal joint portions 250*a* may rotatably couple with its neighboring body 250 that includes another plurality of horizontal joint portions 250*a*.

In detail, a plurality of rotation connectors 251 and 252 may be provided between the neighboring bodies 250. The plurality of rotation connectors 251 and 252 may include a first rotation connector 251 provided at one end of each of the plurality of horizontal joint portions 250*a* and a second rotation connector 252 provided at the other end of each of the plurality of horizontal joint portions 250*a*.

A shaft 253 may be further coupled between the first rotation connector 251 and the second rotation connector 252.

That is, the first rotation connector 251 provided on one surface of the plurality of horizontal joint portions 250*a* that configures a single body 250 may couple with the second rotation connector 252 provided on the other side of the neighboring body 250 to be rotatable at a desired or predetermined angle based on the shaft 253. The shaft 253 may be formed of a hard material and may also be formed of a flexible material.

The first rotation connector 251 may include a first shaft support 251*a* and a second shaft support 251*b* that protrude from one end of the horizontal joint portion 250*a*. The first shaft support 251*a* and the second shaft support 251*b* may be separate from each other at preset distances from one end of the horizontal joint portion 250*a*. The first shaft support 251*a* may be coupled at an upper end of the shaft 253 and the second shaft support 251*b* may be coupled at a lower end of the shaft 253.

Referring to FIG. 7*a*, a plurality of saw-toothed shapes is formed along the outer circumferential surface of the first shaft support 251*a* and the second shaft support 251*b*. However, it is only an example and various examples may be applicable. For example, the saw-toothed shape may not be formed along the outer circumferential surface of the first shaft support 251*a* and the second shaft support 251*b*.

Also, the second rotation connector 252 may include a shaft penetrator 252*a* that extends and protrudes from the other end of the horizontal joint portion 250*a*, and a first angle controller 252*b* and a second angle controller 252*c* that extend and protrude from the other end of the horizontal joint portion 250*a*.

In detail, the first shaft support 251*a* may be engaged with the first angle controller 252*b* and the second shaft support 251*b* may be engaged with the second angle controller 252*c*.

The shaft penetrator 252*a* may be provided between the first shaft support 251*a* and the second shaft support 251*b*. A hole through which the shaft 253 penetrates may be formed on the shaft penetrator 252a. The shaft penetrator 252a may be rotatably coupled based on the shaft 253.

An angle rotation of the first shaft support 251a and the second shaft support 251b may be elastically adjusted by way of the first angle controller 252b and the second angle controller 252c.

For example, the first shaft support 251a and the second shaft support 251b to be engaged with the first angle controller 252b and the second angle controller 252c, respectively, may be formed using an elastic material, for example, plastic and the like. That is, the first shaft support 251a and the second shaft support 251b may rotate based on the shaft penetrator 252a and the shaft 253. Thus, when adjusting an angle, the first angle controller 252b and the second angle controller 252c may control the neighboring bodies 20 to be set at an angle desired by a user.

Here, if the first shaft support 251a and the second shaft support 251b are not formed in the saw-toothed shape, the first angle controller 252b and the second angle controller 252c may not be provided to the second rotation connector 252.

That is, the first angle controller 252b and the second angle controller 252c are not essential configurations of the exemplary embodiment. Although the first angle controller 252b and the second angle controller 252c are not provided to the body 250, each body 250 may rotate based on the shaft 253 relative to its neighboring body 250. Accordingly, referring to FIGS. 7b and 8b, the first angle controller 252b and the second angle controller 252c may be omitted.

The first rotation connector 251 and the second rotation connector 252 may extend and protrude from one surface and the other surface of the horizontal joint portion 250a, respectively, or may be coupled on one surface and the other surface of the horizontal joint portion 250a. It is only an example and the exemplary embodiment is not limited thereto.

In addition to the horizontal joint portion 250a, the body 250 may include a vertical joint portion 250b configured to couple with the horizontal joint portion 250a and to extend in the vertical direction. The horizontal joint portion 250a and the vertical joint portion 250b of the body 250 may be integrally formed.

Referring to FIG. 3, in the thermoelement unit 10 of the thermoelement 1 according to the exemplary embodiment of FIGS. 1 through 4, the thermoelectric material support modules 10a and 10b are disposed between the first joint portion 20a and the third joint portion 20c to be separate from each other. In the thermoelement 3 according to another exemplary embodiment, two thermoelectric material support modules may be coupled with both sides of the vertical joint portion 250b that vertically extends at the center of the body 250. Here, thermoelectric materials 152a and 152b may be connected to the body 250 using adhesives.

In the thermoelement 1 according to the exemplary embodiment, the support body via-hole 13 is formed on the support body 11 and the shaft 110 couples with the support body 11 through the support body via-hole 13. Dissimilar thereto, in the thermoelement 3 according to another exemplary embodiment, the plurality of horizontal joint portions 250a rotatably couple with each other by way of the first and second rotation connectors 251 and 252. Thus, a support body via-hole that penetrates the support body 151 is not required. The neighboring bodies 250 may couple with each other through the first and second rotation connectors 251 and 252. Although a joint portion, for example, the second joint portion 20b of FIG. 4, connects neighboring thermoelement units 150, the neighboring bodies 250 may be rotatably connected to each other and a structure thereof may be further simplified. In the thermoelement 3, a shaft configuration that penetrates the support body 151 is not required. Accordingly, although the support body 151 is absent, the thermoelectric material 152 may be attached between the bodies 250 using adhesives.

The thermoelectric material 152 of the thermoelement 3 may include a P-type thermoelectric material 152a and an N-type thermoelectric material 152b. In the thermoelement 3, the P-type thermoelectric material 152a and the N-type thermoelectric material 152b may be alternately disposed in the horizontal direction and the vertical direction and the neighboring thermoelectric materials 12 may be connected by way of the electrode 350 of a metal material, which is the same as the aforementioned configuration of the thermoelement 1.

The electrode 350 of the thermoelement 3 may include a plurality of first electrodes disposed side by side in the vertical direction on one side of the thermoelement unit 150 and a plurality of second electrodes disposed side by side in the horizontal direction on the other side of the thermoelement unit 150. The electrode 350 may make a surface contact with the thermoelectric material 152, which is the same as in the thermoelement 1 of the aforementioned embodiment.

Also, the electrode 350 may further laterally protrude compared to the body 250. Accordingly, referring to FIGS. 10a and 10b, when applying the thermoelement 3 to a wearable device 7 of FIGS. 10a and 10b, such as a smart watch, etc., the electrode 350 may make a first contact with the skin before the body 250, thereby effectively transferring heat to the thermoelectric material 152, which is the same as in the thermoelement 1 of the aforementioned exemplary embodiment.

Figure 10A:
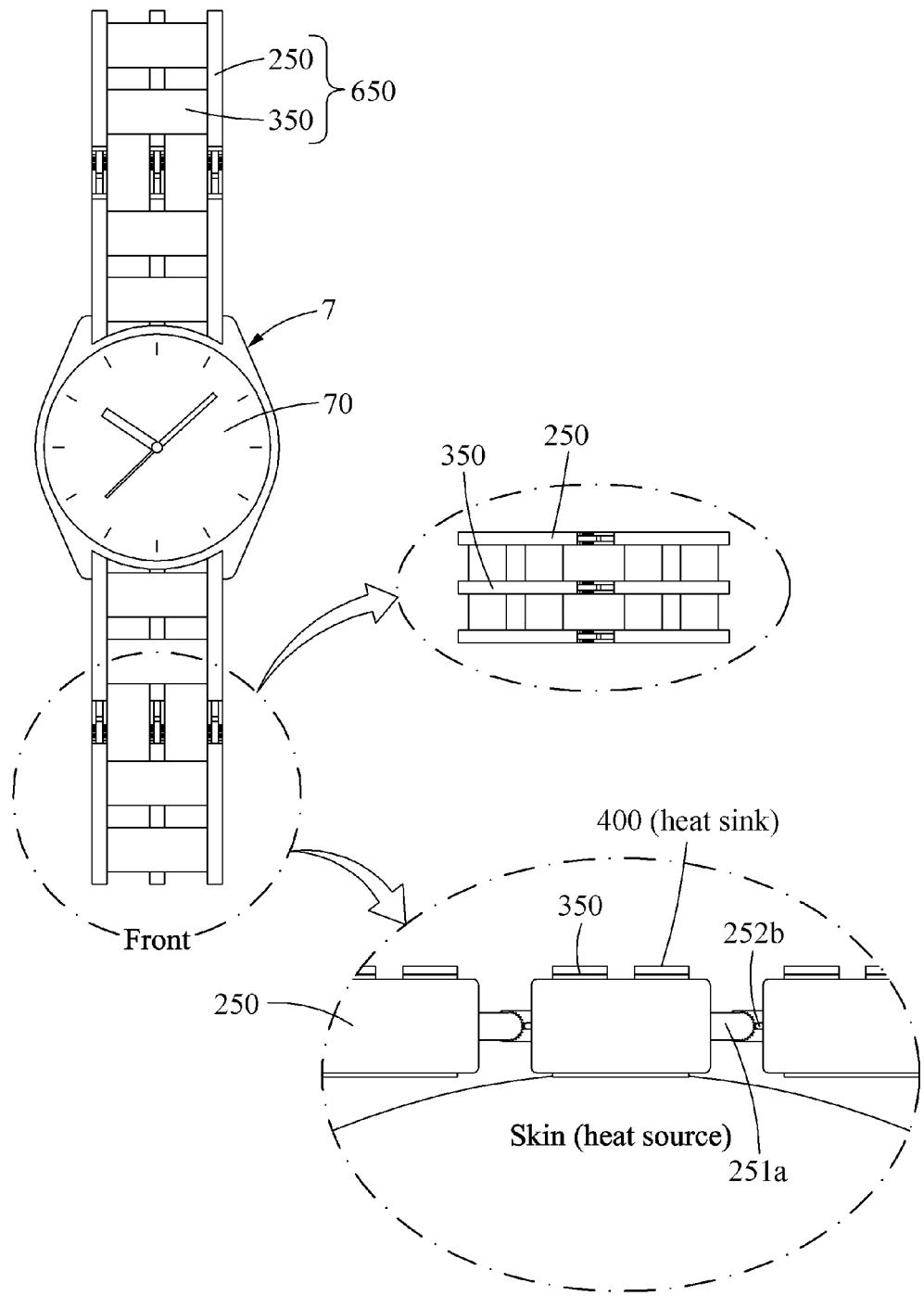
FIG. 10a illustrates an example of a wearable device according to another exemplary embodiment which comprises a heat sink.
Figure 10B:
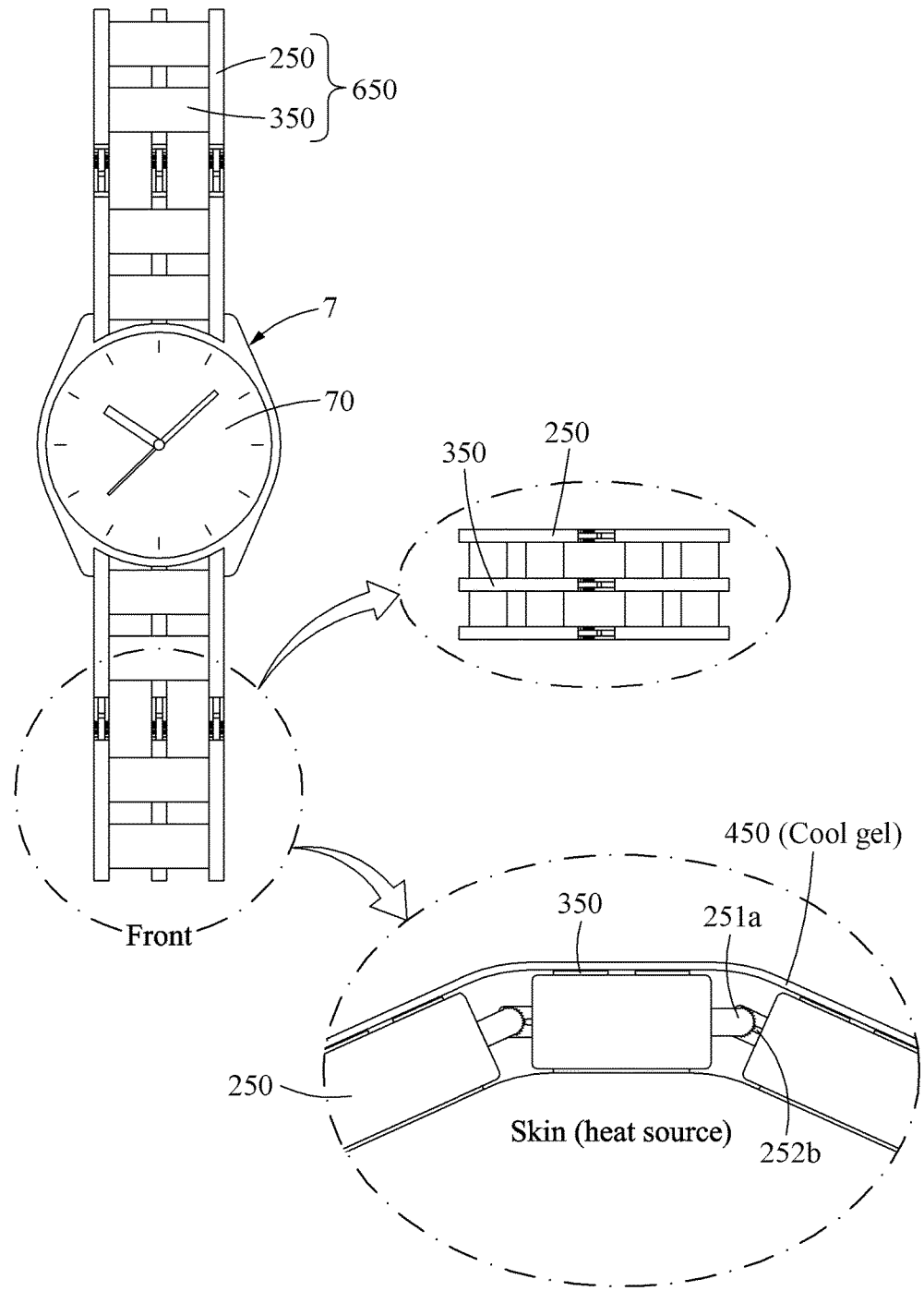
FIG. 10b illustrates an example of a wearable device according to another exemplary embodiment which comprises a cool gel as a heat sink.

FIG. 9a illustrates an example of a wearable device according to an exemplary embodiment which comprises a heat sink, FIG. 9b illustrates an example of a wearable device according to an exemplary embodiment which comprises a cool gel as a heat sink, FIG. 10a illustrates an example of a wearable device according to another exemplary embodiment which comprises a heat sink, FIG. 10b illustrates an example of a wearable device according to another exemplary embodiment which comprises a cool gel as a heat sink.

Referring to FIGS. 9a and 9b, the wearable device 5 may be configured in such a manner that the thermoelectric material 12 and the nonconductive support body 11 are rotatably coupled with the body 20 by way of the shaft 110 and consecutively connected by way of the plurality of joint portions 20a, 20b, and 20c. Referring to FIGS. 10a and 10b, the wearable device 7 may be configured in such a manner that the thermoelectric material 152 and the nonconductive support body 151 are consecutively connected by way of the first and second rotation connectors 251 and 252.

The wearable device 5, 7 according to exemplary embodiments may be flexibly closely attached to the curved surface, such as a wrist of a person. For example, the wearable device 5, 7 may be a smart watch.

The wearable device 5, 7 may include an information provider 50, 70 configured to transfer information to an outside and an energy generator 60, 650 configured to couple with the information provider 50, 70 and to produce electrical energy to be supplied to the information provider 50, 70.

The information provider 50, 70 may provide information to the outside using a vibration, a sound, and a display method. For example, the information provider 50, 70 may be a display screen of a smart watch.

The energy generator 60, 650 may couple with the information provider 50, 70. The information provider 50, 70 may couple with a portion of a human body.

Also, the energy generator 60, 650 may supply electrical energy to the information provider 50, 70. For example, the energy generator 60 of the wearable device 5 may be configured in such a manner that the thermoelement unit 10 coupled with the thermoelectric material 12 and the support body 11 may rotatably couple with the joint portions 20a, 20b, and 20c by way of the shaft 110 and be consecutively connected by way of the plurality of bodies 20. Here, as described above, the electrode 30 may make a first contact with the skin before the body 20, thereby effectively transferring heat to the thermoelectric material 12.

The thermoelectric material 12 encompasses one side and the other side of the support body 11. Thus, when the energy generator 60 encompasses the wrist and the like, one end of the thermoelectric material 12 may be in contact with the skin of a person and the other end of the thermoelectric material 12 may be exposed in the air.

The thermoelectric material 12, 152 included in the energy generator 60, 650 may maintain a sufficient temperature difference based on the support body 11, 151 by using a body temperature of a person as a heat source. Thus, it is possible to produce electricity by using a function of the thermoelement 1, 3. That is, a body temperature generated from the skin of a person may be used as a heat source. When the wearable device 5, 7 is mounted to the human body, a sufficient temperature difference between the heat source and a heat sink 40, 45, 400, 450 for example, the atmosphere, fins, metal block (FIGS. 9a, 10a), cool gel (FIGS. 9b, 10b) may be maintained due to the support body 11, 151 of the thermoelement 1, 3.

The heat sink formed by the cool gel 45, 450 is formed of a flexible material. The single cool gel 45, 450 having long length could be attached the plurality of the electrodes 30 and could be bent.

Accordingly, when the electrode 30, 350 of the thermoelement 1, 3 is connected to the information provider 50, 70, the electrical energy produced at the thermoelement 1, 3 may be used as driving energy of the information provider 50, 70.

Meanwhile, a mechanism opposite to a mechanism of producing the electricity required to drive the wearable device 5, 7 of the thermoelement 1, 3 using the body temperature is also applicable.

That is, when the electricity is applied to the thermoelement 1, 3 of the wearable device 5, 7, the thermoelectric material 12, 152 included in the thermoelement 1, 3 may absorb the surrounding heat.

To this end, the thermoelement 1, 3 of the wearable device 5, 7 may be connected to a battery using a wire and the like. A switch capable of selectively controlling supply of electricity to the thermoelement 1, 3 may be further provided to the battery.

Describing an operation of the wearable device 5, 7 using an example, a user may operate the switch to apply a current to the thermoelement 1, 3 such that the thermoelectric material 12, 152 may absorb the surrounding heat if it is very hot.

Although a few exemplary embodiments have been shown and described, the present disclosure is not limited to the described embodiments. Instead, it would be appreciated by those skilled in the art that changes may be made to these embodiments without departing from the principles and spirit of the disclosure, the scope of which is defined by the claims and their equivalents.

What is claimed is:

1. A thermoelement comprising:
   a body including a plurality of joint portions;
   a plurality of shafts provided to the body; and
   a plurality of thermoelement units,
   wherein the plurality of joint portions include first joint portions, second joint portions and third joint portions,
   wherein each of the plurality of shafts is configured to provide a center of rotation of two first joint portions among the first joint portions, one third joint portion among the third joint portions and two second joint portions among the second joint portions, each of the two first joint portions being separate from the one third joint portion by a predetermined distance,
   wherein one of the two first joint portions is rotatably connected to one of the two second joint portions, and the other one of the two first joint portions is rotatably connected to the other one of the two second joint portions,
   wherein each of the plurality of thermoelement units includes:
      a first thermoelectric material support module including a first support body and a P-type thermoelectric material configured to encompass the first support body,
      a second thermoelectric material support module including a second support body and an N-type thermoelectric material configured to encompass the second support body,
      a third thermoelectric material support module including a third support body and the N-type thermoelectric material configured to encompass the third support body, and
      a fourth thermoelectric material support module including a fourth support body and the P-type thermoelectric material configured to encompass the fourth support body,
   wherein the first thermoelectric material support module and the second thermoelectric material support module are disposed between the one third joint portion and the one of the two first joint portions along a horizontal direction, and the third thermoelectric material support module and the fourth thermoelectric material support module are disposed between the one third joint portion and the other one of the two first joint portions along the horizontal direction,
   wherein the first thermoelectric material support module and the third thermoelectric material support module are disposed along a vertical direction, and the second thermoelectric material support module and the fourth thermoelectric material support module are disposed along the vertical direction,
   wherein the plurality of shafts include a first shaft configured to penetrate the two first joint portions, the two second joint portions, the first support body, the third support body the one third joint portion, and a second shaft configured to penetrate the two first joint portions, other two second joint portions among the second joint portions, the second support body, the fourth support body and the one third joint portion,
   wherein the P-type thermoelectric material of the first thermoelectric material support module is provided on a surface of the first support body to encompass at least a portion of the first support body and is formed in a curved shape, and the first support body is inserted into a space formed inside the P-type thermoelectric material of the first thermoelectric material support module, and the P-type thermoelectric material of the fourth thermoelectric material support module is provided on a surface of the fourth support body to encompass at least a portion of the fourth support body and is formed in a curved shape, and the fourth support body is inserted into a space formed inside the P-type thermoelectric material of the fourth thermoelectric material support module, and wherein the N-type thermoelectric material of the second thermoelectric material support module is provided on a surface of the second support body to encompass at least a portion of the second support body and is formed in a curved shape, and the second support body is inserted into a space formed inside the N-type thermoelectric material of the second thermoelectric material support module, and the N-type thermoelectric material of the third thermoelectric material support module is provided on a surface of the third support body to encompass at least a portion of the third support body and is formed in a curved shape, and the third support body is inserted into a space formed inside the N-type thermoelectric material of the third thermoelectric material support module.

2. The thermoelement of claim 1, wherein each of the plurality of joint portions is formed of a nonconductive material.

3. The thermoelement of claim 1, wherein each of the plurality of shafts is formed of a flexible material.

4. The thermoelement of claim 1, wherein the P-type thermoelectric material of the first thermoelectric material support module and the N-type thermoelectric material of the second thermoelectric material support module are connected by way of an electrode of a metal material, and the N-type thermoelectric material of the third thermoelectric material support module and the P-type thermoelectric material of the fourth thermoelectric material support module are connected by way of an electrode of a metal material, and a plurality of first electrodes are disposed side by side in the horizontal direction on one side of the body and a plurality of second electrodes are disposed side by side in the vertical direction on the other side of the body.

5. The thermoelement of claim 4, wherein each of the first and second electrodes is configured to further laterally protrude compared to each joint portion of the plurality of joint portions.

6. The thermoelement of claim 1, wherein each of the N-type thermoelectric material and the P-type thermoelectric material is attached to two joint portions of the plurality of joint portions by adhesives.

* * * * *